United States Patent [19]

Nakamura et al.

[11] 4,200,191
[45] Apr. 29, 1980

[54] CONTAINER FOR STORAGE OR TRANSPORTATION OF SEMICONDUCTOR CHIPS

[75] Inventors: Yoshiaki Nakamura; Takaharu Abe, both of Tokyo, Japan

[73] Assignee: Nippon Electric Company, Ltd., Tokyo, Japan

[21] Appl. No.: 934,529

[22] Filed: Aug. 17, 1978

[30] Foreign Application Priority Data

Aug. 19, 1977 [JP] Japan .................................. 52-99702

[51] Int. Cl.² ........................................... B65D 73/02
[52] U.S. Cl. ..................................... 206/328; 206/330
[58] Field of Search .............. 206/328, 330, 332, 334, 206/345, 524.8

[56] References Cited

U.S. PATENT DOCUMENTS

| | | | |
|---|---|---|---|
| 3,615,006 | 10/1971 | Freed | 206/328 X |
| 3,719,273 | 3/1973 | Abe | 206/328 |
| 4,091,919 | 5/1978 | MacLeod et al. | 206/524.8 X |

FOREIGN PATENT DOCUMENTS 2619927  3/1977  Fed. Rep. of Germany ........ 206/524.8

Primary Examiner—Herbert F. Ross
Attorney, Agent, or Firm—Ostrolenk, Faber, Gerb & Soffen

[57] ABSTRACT

A container for semiconductor chips is disclosed. The container includes an annular ring having a first diameter and an annular lower casing having a second diameter, greater than the first diameter. The annular lower container houses the annular ring. A plastic film, holding the semiconductor chips, is stretched over an annular opening in the annular ring. An upper container mates with the lower container to form an air-tight housing for the annular ring. The upper container is shaped in such a manner that the upper container fixes the annular ring in place but does not contact the semiconductor chip.

14 Claims, 2 Drawing Figures

CONTAINER FOR STORAGE OR TRANSPORTATION OF SEMICONDUCTOR CHIPS

BACKGROUND OF THE INVENTION

The present invention relates to the semiconductor art, and more particularly to a container for semiconductor chips which container is capable of storing and transporting the semiconductor chips separated from a semiconductor wafer without causing disarrangement of the semiconductor chips.

In general, a number of semiconductor elements, such as transistors and integrated circuits, arranged in a scored grid-like pattern on a semiconductor wafer are formed in the wafer through known processes such as impurity diffusion, metal evaporation, selective etching and other processes, separated into individual chips, and then encased in semiconductor cases to provide semiconductor devices. One known method for breaking the chips from the wafer, is disclosed in U.S. Pat. No. 3,040,489 to Costa. This patent discloses a semiconductor dicing or breaking technique in which a semiconductor wafer, scribed on the surface thereof by a diamond scriber, is sandwiched by two cellophane sheets and then broken into individual chips by a steel or bronze roller. The dicing or breaking technique using an adhesive polyvinyl chloride film instead of the cellophane sheets of Costa has been proposed in Japanese Patent Publication No. 41-10372 published on June 6, 1966 by Nippon Electric Co., Ltd. Y. Nakamura, one of the inventors of the present invention has proposed, in Japanese Patent Publication No. 48-26420 published on Aug. 10, 1973, a spreading technique in connection with the broken chips located on the polyvinyl chloride film. According to this technique the polyvinyl film is fixed at its periphery to a ring fixture, spread by inserting a cylindrical ring into the center hole of the ring fixture and then fixed to the cylindrical ring by a rubber band, while the polyvinyl chloride film is cut off from the ring fixture to separate the cylindrical ring carrying the chips from the ring fixture.

The inventor Y. Nakamura has also proposed a method of cleansing the broken chips for an automatic encasing process in non-examined Japanese Patent Application published on Apr. 27, 1977 under No. 52-52568. According to this cleansing method, the rear surface of the semiconductor wafer prior to scribing process is preliminarily bonded, under heating, to a certain plastic film such as polyvinyl chloride film containing a suitable amount of plasticizer. The wafer is then scribed along score lines, and broken and separated into individual chips. Pure water is then showered uniformly onto the surfaces of the chips to remove vaious contaminations on the surfaces of the chips, especially silicon dust produced during the scribing or breaking process. Therefore, the chips are dried by centrifugalization and transferred directly to an automatic encasing process.

When the cleaned elements are transferred directly to an automatic encasing process, the separated chips can be easily transferred by locating the breaking process and the automatic encasing process in the same space and continuously processing these steps. However, when the sites of these operations are remoted from each other or when the chips as separated must be stored for some reason (such as production control requirement etc.), or when the chips are sold before they are encased, it is necessary to provide a method and apparatus for storing or transporting the chips which method retains the purity of the chip during storage or transportation.

When storing the separated chips arranged on the plastic film, it is standard practice to employ, for example, a clean bench or the like. While such benches are useful for storing the separated chips, they are not suitable for transporting the separated chips. Thus, when the elements must be transported, it is conventional to remove the separated chips from the plastic film and then to place each of them into a clean case. This method is convenient for the purpose of transportation, but not recommendable because it involves a problem in keeping the chips clean and needs increased number of steps. By way of example, this method will inevitably introduce contamination into the chips during removal of the separated chips from the plastic film (with tweezers etc.) or due to foreign matters brought into contact with the surfaces of the chips during packaging of the chips into the respective cases. This method necessitates a tremendous number of steps. Alternatively, the chips may be transported in such a manner that plural number of chips are randomly charged in a bottle. This, however, is less recommendable not only because of inconvenience in the succeeding processes but because of breakage or flaw caused on elements due to collision between the chips during the transportation.

OBJECTS AND BRIEF SUMMARY OF THE INVENTION

It is an object of the present invention to provide a container for semiconductor chips which enables transportation or storage of the chips as arranged in a predetermined pattern on a plastic film, without causing disorder and contamination.

In accordance with the present invention, there is provided a container for semiconductor chips comprising a ring on which a plastic film is fixed so as to mount semiconductor chips thereon, and a circular casing adapted to accommodate therein the entire ring.

In one aspect of the present invention, the material for the ring is selected not from metals which have on adverse influence on the chips due to their possible gas generation but from plastics such as acrylonitrile-styrene resin and acrylonitrile-butadiene-styrene resin storage or transportation.

In another aspect of the present invention, the casing has an upper casing member which has an uniformly tapered inner surface at its peripheral portion to fix the circular edge of the ring so that the ring may always be positioned centrally in the casing.

In a still another aspect of the present invention, the upper and lower casing members have specific external configurations adapted to provide snug coupling of the casings to each other for the convenience of transportation.

In a further aspect of the present invention, the material of the casing is selected from transparent plastic free from gas generation during storage.

The present invention enables storage or transportation of the semiconductor chips in such a manner that the semiconductor chips arranged on the plastic film are kept from contact with any foreign matters and retained in an inert gas atmosphere. Therefore, during storage or transportation, the disorder of the arranged chips, and the contamination and the breaking or flaw of the chips are completely avoided. The container of this invention is compact and convenient for transportation. Further, by using the container of this invention to encase the semiconductor chips for storage or transportation, the number of processing steps required are reduced.

BRIEF DESCRIPTION OF THE INVENTION

The above and further objects, features and advantages of the present invention will be more apparent from the following detailed description of the preferred embodiments taken in connection with the accompanying drawings, in which:

FIG. 1 is a schematic cross sectional view of a ring on which a plastic film is fixed so as to mount a plurality of separated semiconductor chips; and FIG. 2 is a schematic cross sectional view of a container for storage and transportation of semiconductor chips in accordance with the present invention, showing the same with semiconductor chips contained therein.

DETAILED DESCRIPTION OF THE PREFERRED EMBODIMENT

Figure 1:
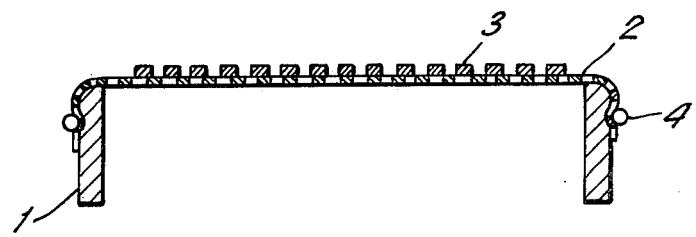

Referring now to the drawings, whenever like numerals indicate like elements there is illustrated one preferred embodiment of the present invention. FIG. 1 shows schematically a ring 1, a plastic film 2 fixed to the ring 1 by a rubber band 4 and semiconductor chips 3 arranged on the plastic film 2. The semiconductor chips 3 are formed in a conventional manner such that, after a plurality of semiconductor elements are formed on a semiconductor wafer, the semiconductor wafer is bonded on a plastic film 2 and scribed and broken into individual chips 3. Thereafter, periphery of the plastic film 2 is fixed to a ring-like fixture (not shown), and the film 2 is then uniformly stretched to separate the chips 3 so as to space them from each other by inserting the ring 1 into the center hole of the ring-like fixture. Then, the film 2 is fixed to the ring 1 by the rubber band 4, and cut off from the ring-like fixture.

The ring 1 is dimensioned so as to have an outer diameter of 90 mm and made of polycarbonate, acrylonitrile-styrene or acrylonitrile-butadiene-styrene. The plastic film 2 has an adhesive surface and made of polyvinyl chloride containing 50% of dioctyl phthalate. The rubber band 4 is made of Teflon (trade mark).

Figure 2:
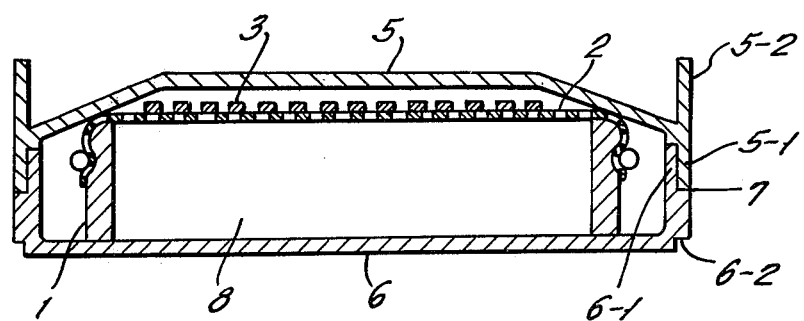

FIG. 2 shows a container for semiconductor chips in accordance with the present invention, wherein the chips 3 are disposed on the ring 1 as shown in FIG. 1. Stated illustratively, the ring 1 with the chips 3 disposed thereon is placed in a lower casing member 6. This lower casing member 6 is so dimensioned that it has an outer diameter of 104 mm, a thickness of 2 mm and a height of 18 mm when used with a ring 1 which has an outer diameter of 90 mm. The casing member 6 is made of an acrylonitrile-styrene resin or an acrylonitrile-butadiene-styrene resin. An upper casing member 5, matable with the lower casing member 6, is so dimensioned that it has an outer diameter of 104 mm, a thickness of 2 mm and a height of 16 mm, and also made of an acrylonitrile-styrene resin or an acrylonitrile-butadiene-styrene resin. The upper and lower casing members 5 and 6 are tightly coupled to each other through mating portions 5-1 and 6-1 which have the same thickness of 1 mm and the same height of 6 mm. The upper casing member 5 is so shaped as to have a tapered portion at its inner periphery portion as depicted in FIG. 2. The tapered portion is adapted to contact the shoulder or the circular edge of the ring 1, so that the ring 1 may always be fixed centrally in the container. The upper casing member 5 has a central flat portion of about 72 mm in diameter which is never brought into contact with the chips 3. The interior of the container is filled with nitrogen gas. This is done, for example, by placing the semiconductor chips 3 on the ring 1 into the casing in a nitrogen gas box. The atmosphere in the container may be well retained by the snug or close mating or fitting between the mating portions 5-1 and 6-1, but more positively kept by applying an adhesive tape 7, such as adhesive cellophane tape, onto the connecting portion. Thus, the separated chips 3 treated in the cleansing process are completely isolated from the air.

For convenience of transporting, by stacking, a plurality of containers in accordance with the present invention, a projection 5-2 is provided at the periphery of the upper casing member 5 and a recess 6-2 is formed in the lower casing member 6 at its lower peripheral portion. The projection 5-2 is adapted to be fitted in the recess 6-2 of another casing to be securedly coupled to each other.

During the transportation, since the chips 3 encased in the container are completely isolated from the air, they are not affected by the external air at all. Furthermore, it is to be noted that, with respect to a temperature fluctuation ($-30°$ C. to $+60°$ C.), none of the resinous materials employed for the components disposed inside the container, such as the inner wall of the container, the plastic film 2, and the surfaces of the ring 1 will generate gases. In fact, when the container with the semiconductor chips 3 disposed therein was allowed to stand still for a long time at a place where no special attention was paid to keep cleanliness as required for semiconductors, the electrical characteristics of the semiconductor chips 3, which are liable to be influenced by the surface conditions of the chips, such as static characteristics and noise characteristics at a low frequency, did not show any change as compared with those before the storage. Accordingly, the chips 3 held on the plastic film 2 in accordance with the present invention can be fed directly to the fabrication process even after a long storage or transportation to a remoted place.

As noted above, when the semiconductor chips must be stored or transported between the breaking process and the fabrication process, the present invention can provide a container of a simple structure which is suitable for storage or transportation of the semiconductor chips 3. This invention should never be limited with respect to materials or configurations to those specified in the preferred embodiments of the present invention and interpreted to included any change or modification as for as it can attain the object of the present invention.

What is claimed is:

1. A container of semiconductor chips, comprising:
   a support ring having an upper edge portion;
   a plastic film carrying said semiconductor chips thereon and supported by said support ring with said plastic film overlying said outer edge portion;
   a lower casing member adapted to receive said support ring: p1 an upper casing member matable with said lower casing, said upper casing member having an inner face of a frustoconical shape, a sloping portion of said inner face being in contact with said plastic film along said outer edge portion of said support ring in such a manner that said support ring is maintained in a predetermined orientation in said casing, said upper casing member being so formed that it does not contact any of said semiconductor chips.

2. A container of semiconductor chips as claimed in claim 1, wherein said ring, said upper casing member and said lower casing member are made of a resinous material generating no gas which affects the electrical characteristics of said semiconductor chips.

3. A container of semiconductor chips as claimed in claim 2, wherein said upper casing member and said lower casing member are made of a material selected from the group of acrylonitrile-styrene and acrylonitrile-butadiene-styrene.

4. A container of semiconductor chips as claimed in claim 2, wherein said ring is made of the material selected from a group of polycarbonate, acrylonitrile-styrene and acrylonitrile-butadiene-styrene.

5. A container of semiconductor chips as claimed in claim 1, wherein said lower casing member has a recess at a periphery of its lower surface, and said upper casing member has a projection at a periphery of its upper surface, said projection being adapted to be fitted in said recess.

6. The container of claim 1, wherein said lower casing member has a flat and smooth inner bottom surface in contact with the lower edge of said ring.

7. A container of semiconductor chips, comprising:
an annular ring having a first diameter;
a plastic film stretched over an opening in said ring, said plastic film holding said semiconductor chips thereon;
a lower casing having a second diameter greater than said first diameter, said lower casing housing said annular ring; and
an upper casing mating with said lower casing to form an air-tight housing for said annular ring, said upper casing including a frustoconical inner face the sloping portion of which cooperates with an outer edge of said annular ring so as to hold said annular ring stationary in said lower casing, and said upper casing being out of contact with all of said semiconductor chips.

8. The container of claim 7, wherein said air-tight housing is filled with nitrogen gas.

9. The container of claim 7 or claim 8, further including an air-tight strip located around the mating portions of said upper and lower casing.

10. The container of claim 6, wherein said ring, said upper casing and said lower casing are made of a resinous material generating no gas which affects the electrical characteristics of said semiconductor chips.

11. The container of claim 10, wherein said upper casing and said lower casing are made of a material selected from the group of acrylonitrile-styrene and acrylonitrile-butadiene-styrene.

12. The container of claim 10, wherein said ring is made of a material selected from the group of polycarbonate, acrylonitrile-styrene and acrylonitrile-butadiene-styrene.

13. The container of claim 7, wherein said lower casing member has a recess at a periphery of its lower surface and said upper casing member has a projection at a periphery of its upper surface, said projection being adapted to be fitted in said recess.

14. The container of claim 1, wherein said lower casing has a flat and smooth inner bottom surface in contact with the lower edge of said annular ring.

* * * * *